(12) United States Patent
Lichtensteiger et al.

(10) Patent No.: US 10,269,643 B2
(45) Date of Patent: Apr. 23, 2019

(54) METHOD AND DEVICE FOR THE PRODUCTION OF WAFERS WITH A PRE-DEFINED BREAK INITIATION POINT

(71) Applicant: Siltectra GmbH, Dresden (DE)

(72) Inventors: Lukas Lichtensteiger, Zurich (CH); Wolfram Drescher, Dresden (DE)

(73) Assignee: Siltectra, GmbH (DE)

( * ) Notice: Subject to any disclaimer, the term of this patent is extended or adjusted under 35 U.S.C. 154(b) by 0 days.

(21) Appl. No.: 14/888,928

(22) PCT Filed: May 5, 2014

(86) PCT No.: PCT/EP2014/059120
§ 371 (c)(1),
(2) Date: Nov. 3, 2015

(87) PCT Pub. No.: WO2014/177721
PCT Pub. Date: Nov. 6, 2014

(65) Prior Publication Data
US 2016/0064283 A1 Mar. 3, 2016

(30) Foreign Application Priority Data
May 3, 2013 (DE) .......................... 10 2013 007 672

(51) Int. Cl.
*H01L 21/78* (2006.01)
*H01L 21/02* (2006.01)
(Continued)

(52) U.S. Cl.
CPC .... *H01L 21/7806* (2013.01); *H01L 21/02002* (2013.01); *H01L 21/304* (2013.01); *H01L 21/67092* (2013.01); *H01L 21/6835* (2013.01)

(58) Field of Classification Search
CPC combination set(s) only.
See application file for complete search history.

(56) References Cited

U.S. PATENT DOCUMENTS

2002/0147442 A1 * 10/2002 Shadduck ........... A61F 9/00781
606/6
2010/0310775 A1 12/2010 Bedell
(Continued)

FOREIGN PATENT DOCUMENTS

CN 102856232 1/2013
TW 200827770 7/2008
(Continued)

OTHER PUBLICATIONS

English Translation of Written Opinion for corresponding PCT application—PCT/EP2014/059120.
Saha Sayan et al: "Single heterojunction solar cells on exfoliated flexible PRG 25 m thick mono-crystalline Silicon su", Applied Physics Letters, American Institute of Physics, US, Apr. 2013, (102), 163904.
(Continued)

*Primary Examiner* — Ratisha Mehta
(74) *Attorney, Agent, or Firm* — Great Lakes Intellectual Property, PLLC

(57) ABSTRACT

The present invention relates to a method for the production of layers of solid material, in particular for use as wafers. The method may include the following steps: providing a workpiece for the separation of the layers of solid material with the workpiece optionally having at least one exposed surface, producing and/or providing a carrier unit for receiving at least one layer of solid material having the carrier unit optionally having a receiving layer for holding the layer of solid material, attaching the receiving layer to the exposed surface of the workpiece forming a composite structure, producing a break initiation point by means of pre-defined local stress induction in the peripheral region, including at the edge, of the workpiece, and separating the layer of solid material from the workpiece starting from the break initiation point.

14 Claims, 12 Drawing Sheets

(51) Int. Cl.
*H01L 21/683* (2006.01)
*H01L 21/67* (2006.01)
*H01L 21/304* (2006.01)

(56) References Cited

U.S. PATENT DOCUMENTS

2012/0282782 A1  11/2012  Bedell
2013/0082357 A1* 4/2013  Alhomoudi ....... H01L 31/02363
                                                                257/616

FOREIGN PATENT DOCUMENTS

| TW | 201212267 | 3/2012 |
| WO | 2009061353 | 5/2009 |
| WO | 2010072675 | 7/2010 |

OTHER PUBLICATIONS

TW office action for related application.
Analysis of stress intensity factors and I-stress to control crack propagation for kerf-less spalling of single crystal silicon foils Authors: P-O Bouchard, Bernacki M, Parks D M Publication data: Computational Materials Science, Mar. 1, 2013, Elsevier Source info: vol: 69, pp. 243-250.
Single heterojunction solar cells on exfoliated flexible PRG 25 m thick mono-crystalline silicon su Authors: Saha Sayan, Hilali Mohamed M, Onyegam Emmanuel U, Sarkar Dabraj, Jawarani Dharmesh, Rao Rajesh A, Mathew Leo, Smith Ryan S, Xu Dewei, Das Ujjwal K, Sopori Bhushan, Banerjee Sanjay K Publication data: Applied Physics Letters,, Apr. 22, 2013, A I P Publishing LLC, US Source info: vol. 102, No. 16, pp. 163904-163904-5.

* cited by examiner

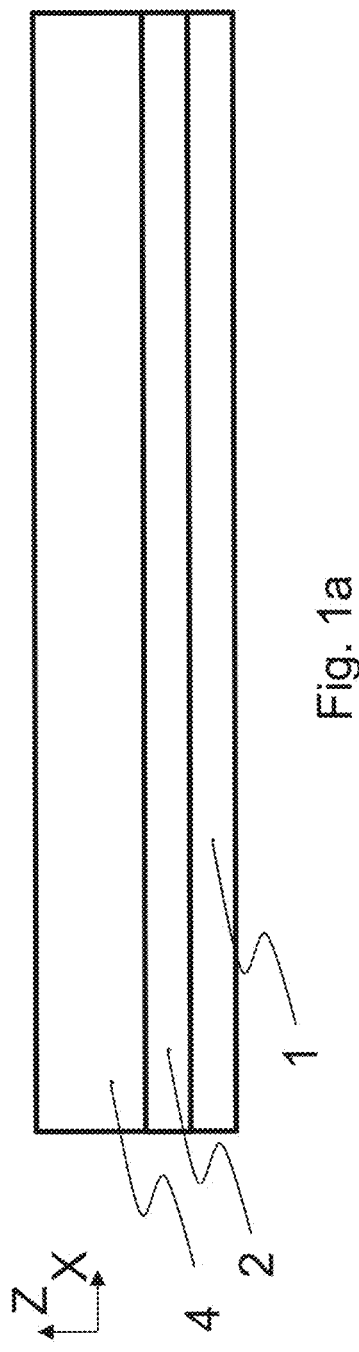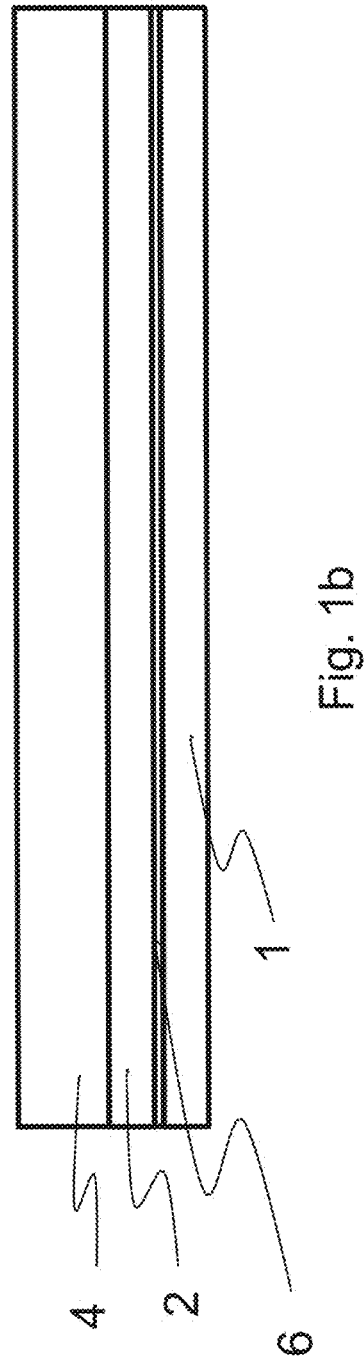

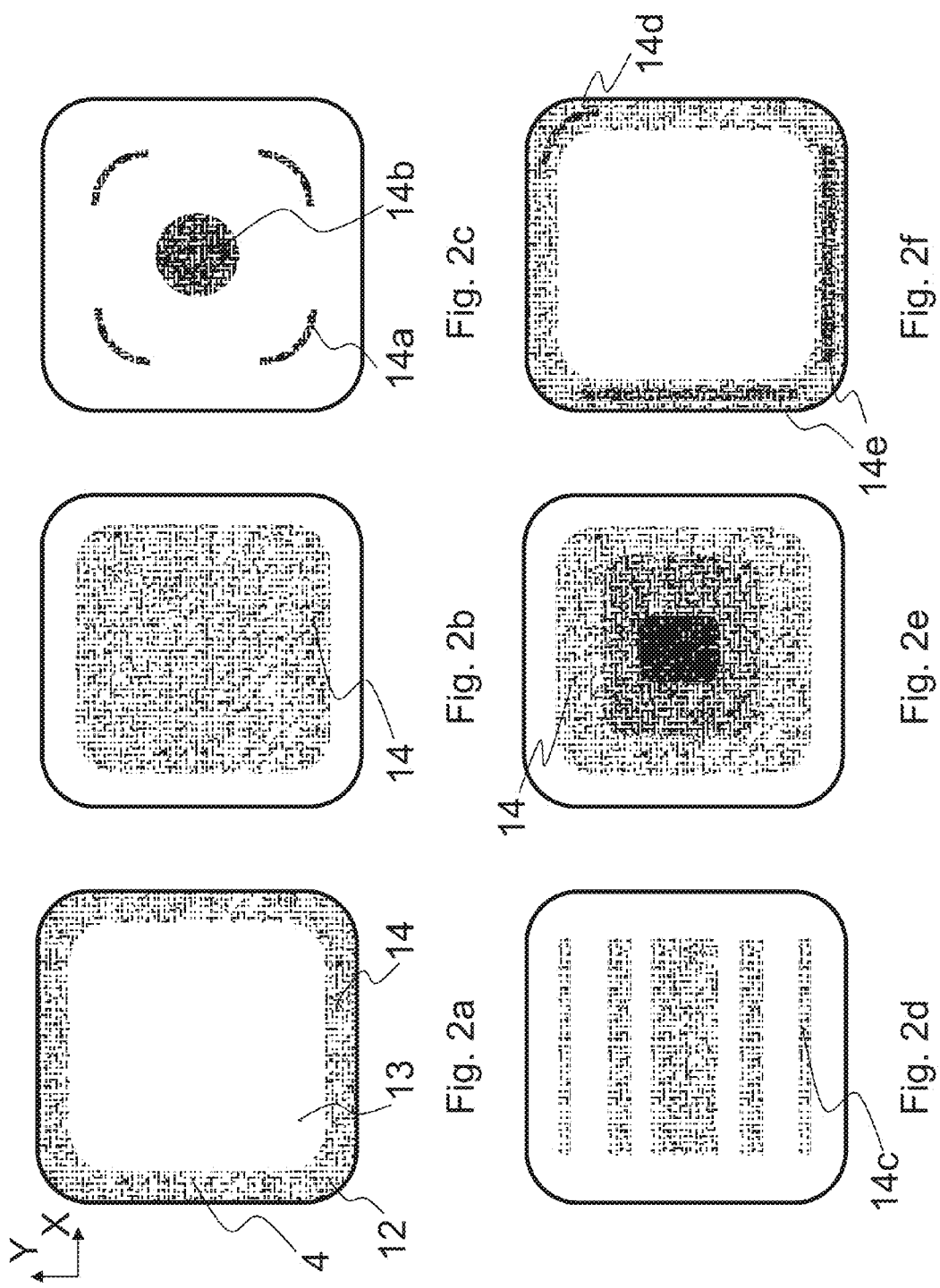

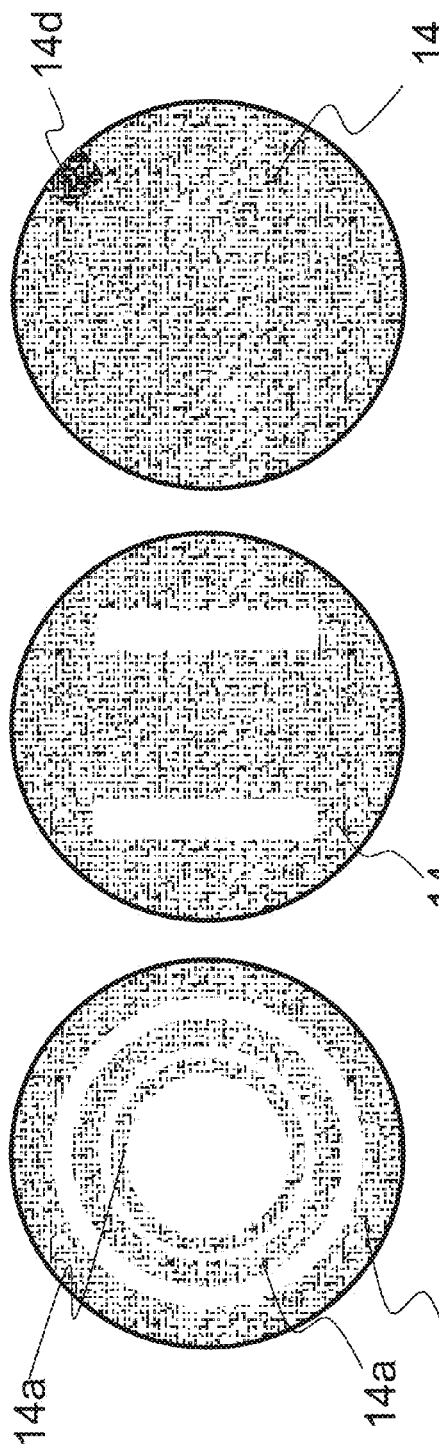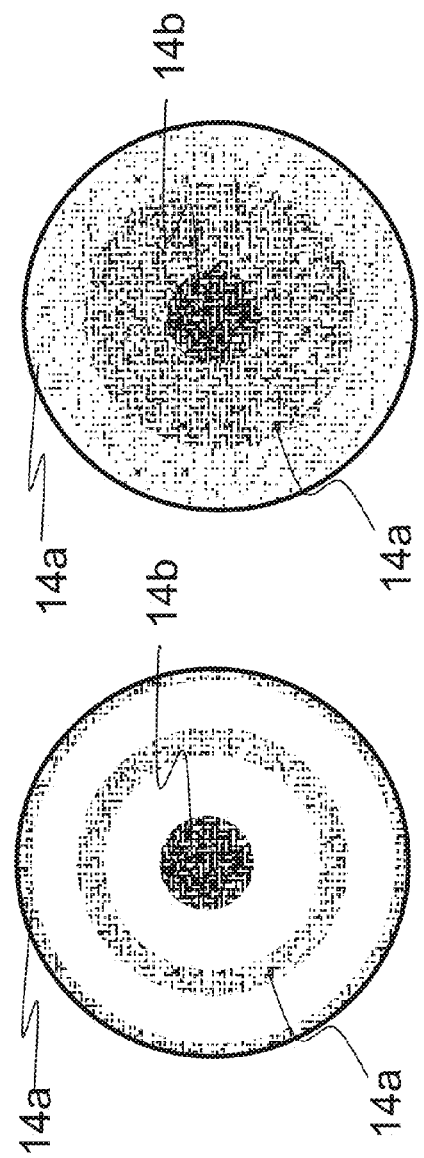
Fig. 3a Fig. 3b Fig. 3c Fig. 3d Fig. 3e

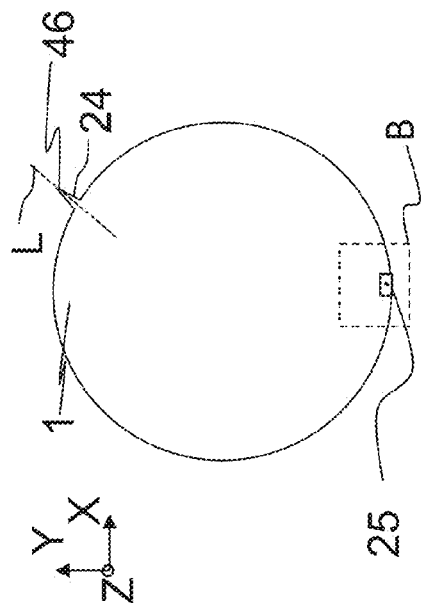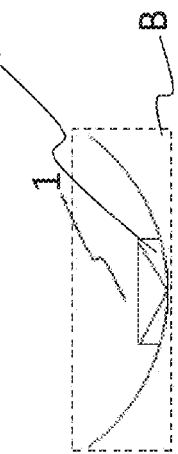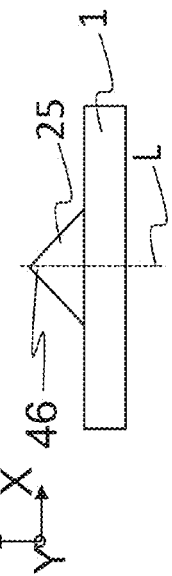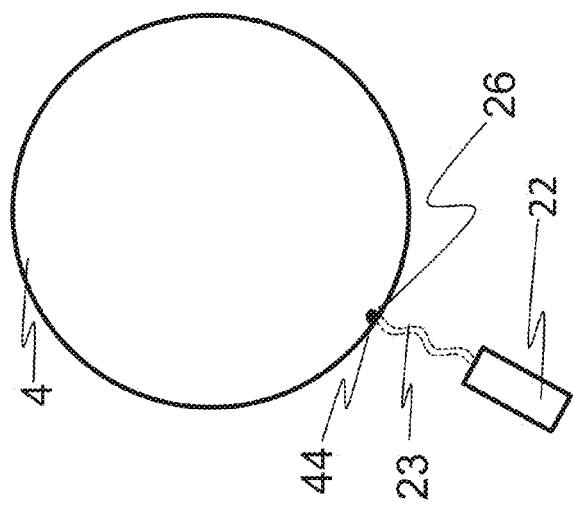

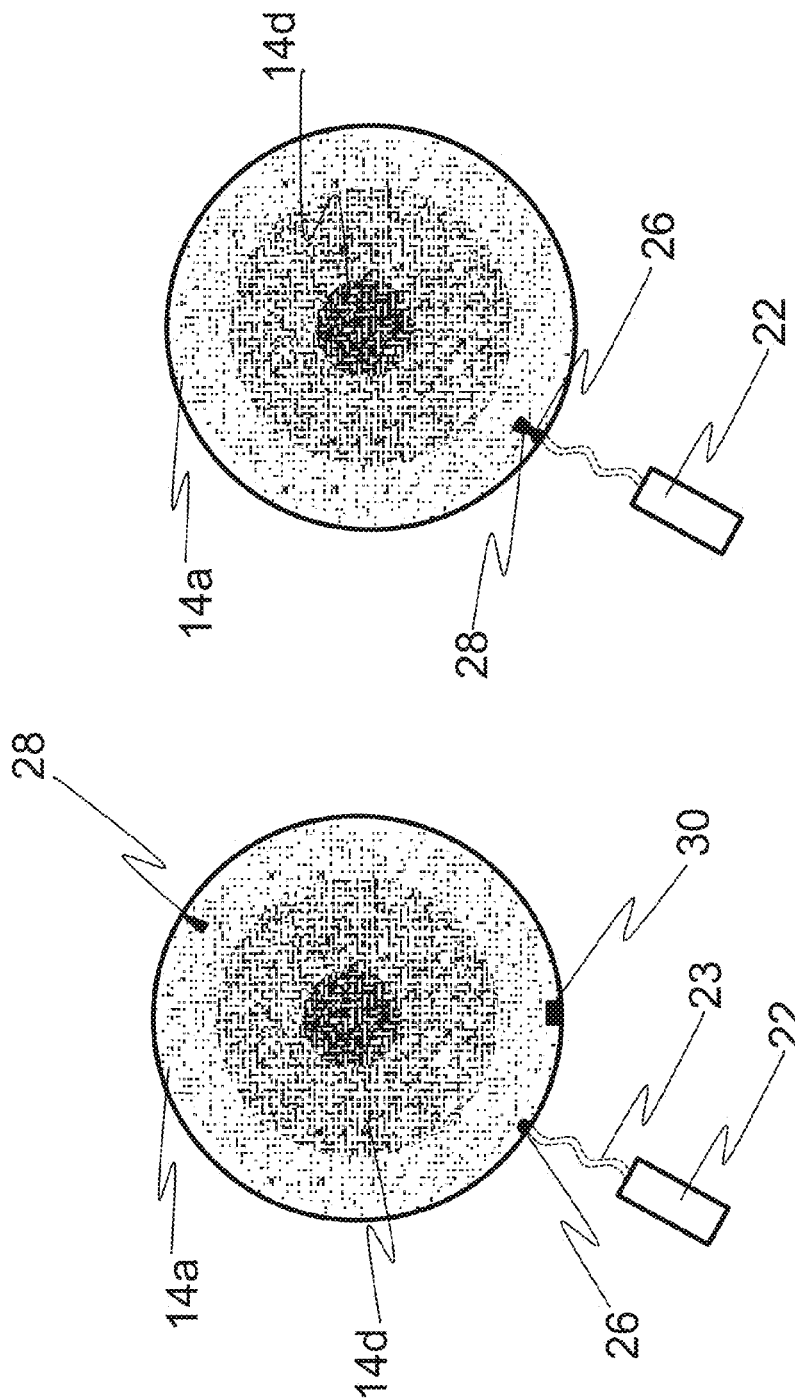

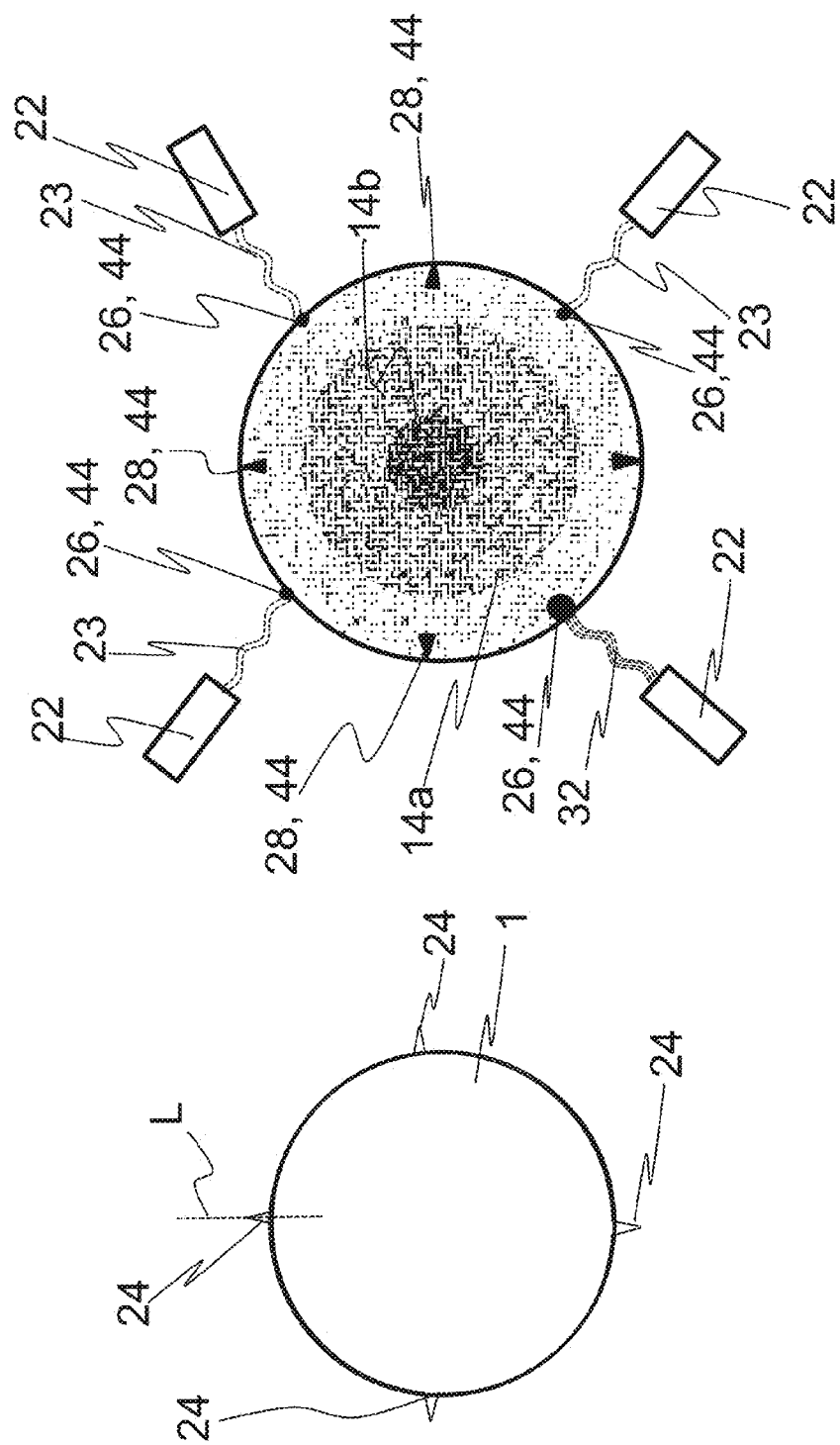

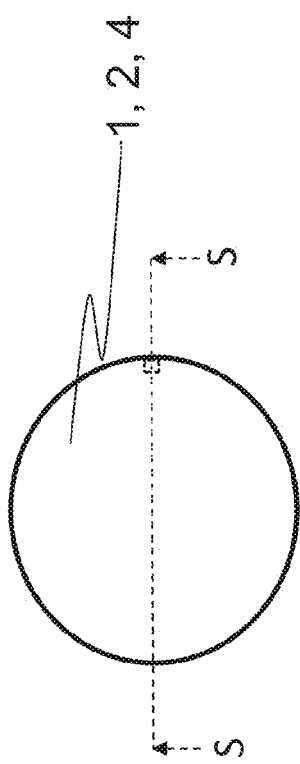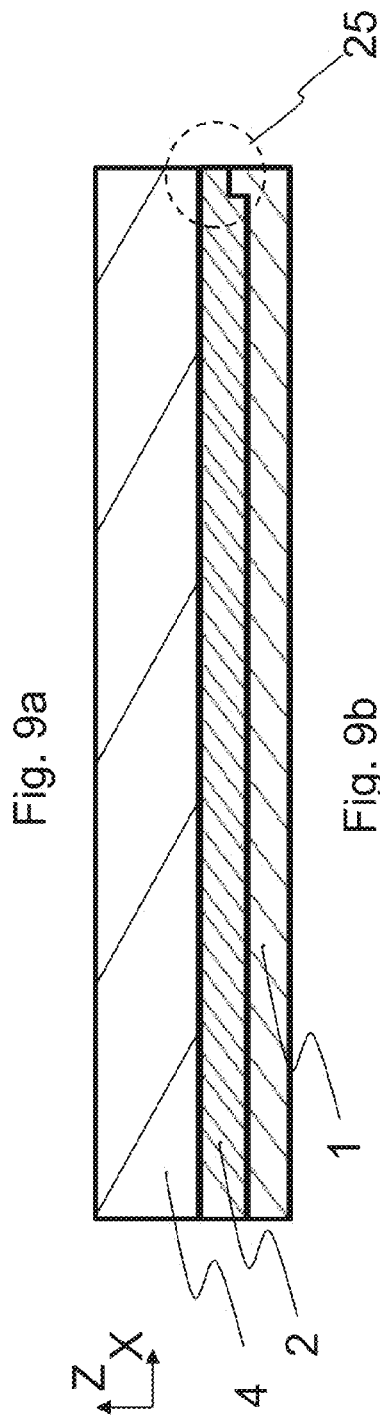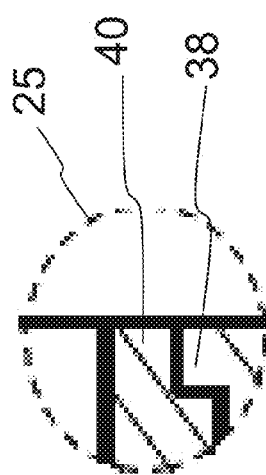

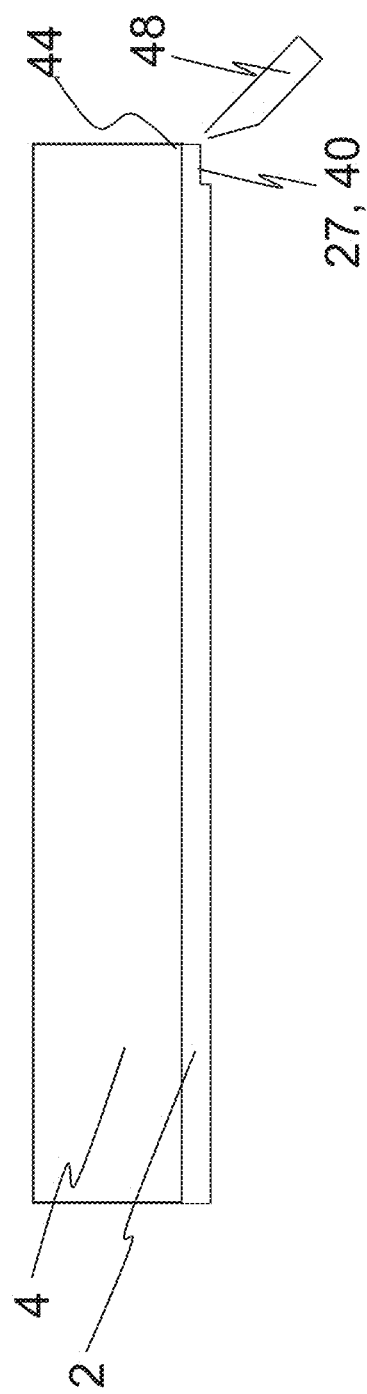
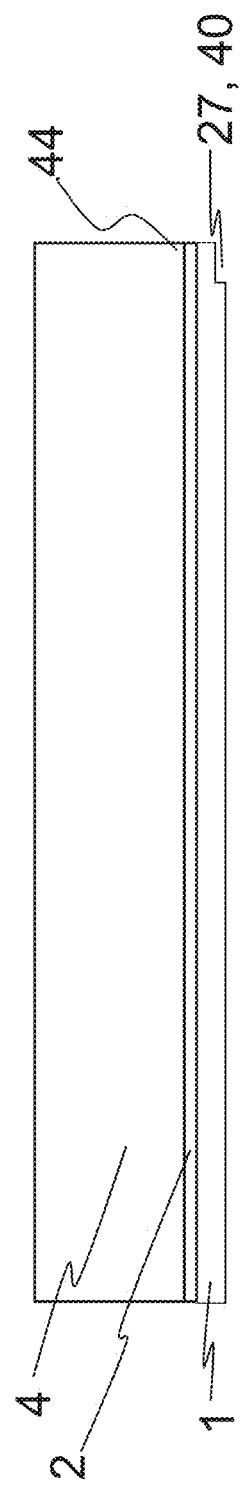
Fig. 11a
Fig. 11b

United States Patent US 10,269,643 B2

METHOD AND DEVICE FOR THE PRODUCTION OF WAFERS WITH A PRE-DEFINED BREAK INITIATION POINT

TECHNICAL FIELD

The present invention relates to a method for the production of layers of solid material and to a device for the production of layers of solid material, in particular wafers.

BACKGROUND

In many technical domains (e.g. microelectronic or photovoltaic technology) materials, such as e.g. silicon, germanium or sapphire, are often needed in the form of thin discs and plates (so-called wafers). As standard, such wafers are currently produced by sawing from an ingot, relatively large material losses ("kerf loss") occurring. Since the source material used is often very expensive, great efforts are being made to produce such wafers with less material consumption and so more efficiently and inexpensively.

For example, with the currently normal methods almost 50% of the material used is lost as "kerf loss" when producing silicon wafers for solar cells alone. Considered globally, this corresponds to an annual loss of more than 2 billion euros. Since the cost of the wafer makes up the greatest percentage of the cost of the finished solar cell (over 40%), the cost of solar cells could be significantly reduced by making appropriate improvements to the wafer production.

Methods which dispense with the conventional sawing and can separate thin wafers directly from a thicker workpiece, e.g. by using temperature-induced stresses, appear to be particularly attractive for this type of wafer production without kerf loss ("kerf-free wafering"). These include in particular methods as described e.g. in PCT/US2008/012140 and PCT/EP2009/067539 where a polymer layer applied to the workpiece is used in order to produce these stresses.

In the aforementioned methods the polymer layer has a thermal expansion coefficient that is higher by approximately two orders of magnitude in comparison to the workpiece. Moreover, by utilising a glass transition a relatively high elasticity modulus can be achieved in the polymer layer so that sufficiently large stresses can be induced in the polymer layer/workpiece layer system by cooling in order to enable the separation of the wafer from the workpiece.

In the method according to the current prior art, the breaking process, which leads to separation of the wafer from the workpiece, is initiated randomly, neither the precise time of initiating the break nor the location being able to be specified. Often the break starts at a random weakpoint of the wafer, mostly at the edge or at the periphery, at a moment where the stress exceeds a critical value locally. As a result of this uncertainty regarding the location and time of the break being initiated, it is difficult to guarantee a stress field that is optimal for the breaking process at the time of initiating the break and at the place of initiating the break. This may lead to an unfavourable course of the break front and in particular to significant thickness variations of the separated wafer. Often, for example, the break runs in a number of break fronts along different directions, large and often abrupt thickness variations in the separated wafer possibly occurring if they converge again subsequently or disadvantageous overlapping of these break fronts taking place.

SUMMARY

It is therefore the object of the present invention to provide an appropriate method and an appropriate device for the production of layers of solid material and/or plates of solid material which improve the quality of the wafers produced in comparison to the known methods, in particular by the curvature of the separated layers of solid material or wafers being reduced and an even layer thickness of the wafer being produced. Additional objects of the present invention are to reduce the undesirable oscillations that occur during the break propagation, to improve the heat contact with the layer system and additionally to enable simpler and gentler handling of the layers of solid material and or plates of solid material after separation.

The aforementioned object is achieved according to the invention by a method for the production of layers of solid material, in particular for use as wafers, according to the subject matter of claim 1. The production method according to the invention comprises the following steps here: providing a workpiece for the separation of the layers of solid material, the workpiece having at least one exposed surface, producing and/or providing a carrier unit for receiving at least one layer of solid material, the carrier unit having a receiving layer for holding the layer of solid material, attaching the receiving layer to the exposed surface of the workpiece, thus forming a composite structure, producing a break initiation point by means of pre-defined local stress induction in the peripheral region, in particular at the edge, of the workpiece or wafer, and separating the layer of solid material from the workpiece starting from the break initiation point.

It is therefore the idea of the present invention to introduce one or more defined local stress peaks into the layer system in order to specifically influence the break initiation. By means of spatially local stress peaks the location of the break initiation can thus be chosen, while by means of temporal stress peaks (stress pulses) the time of the break initiation can be controlled.

Therefore, the present invention provides a method for the production of wafers which improves the quality of the wafers produced in comparison to previous methods by being able to control the location and/or time of break initiation better. With the present invention, i.e. with the use of layer systems with defined local stress peaks the problems known from the prior art are therefore eliminated, and the object specified above is thus resolved in an extremely advantageous manner.

The solution according to the invention is therefore based on the knowledge that in the methods according to the previous prior art, the separation of a wafer starts in each case at the edge of the wafer, and mostly at a corner. It has been possible to demonstrate this knowledge by means of video recordings using a high speed camera. The wafer starts to separate from this point by generally two break fronts running along the edge of the wafer in respectively opposing circulating directions and finally converging again on approximately the opposite side of the wafer. Only after this does the centre of the wafer separate. This behaviour can be explained by the fact that the edge of the wafer always has significantly more defects in the material in comparison to the inside, and this leads to locally reduced breaking strength, due to which the separation of the wafer along the edge is ultimately possible with relatively smaller stresses.

Additional advantageous configurations of the invention are the subject matter of the sub-claims.

In the examples of use described here a thicker wafer is preferably used as the workpiece, from which wafer one or a number of thinner wafers are separated using the described method according to the invention.

According to another preferred embodiment of the present invention the pre-defined local stress induction is brought about by exposing the workpiece to locally introduced forces, local tempering, in particular cooling, local exposure to waves, in particular sound waves or light waves, local exposure to fields, in particular electromagnetic fields, local exposure to electricity and/or local exposure to radiation from a radiation source.

In addition or alternatively it is also possible, by specifically generating regions/layers of different temperatures in the polymer, to generate corresponding regions/layers with different thermal expansion coefficients and elasticity moduli. Under certain circumstances, physical values other than the temperature can also influence the thermal expansion coefficient of a corresponding polymer layer locally (e.g. swelling due to solvent) and can then be used for the specific generation of regions/layers with different thermal expansion coefficients.

Moreover, the mechanical stress distribution in the layer structure is not only determined by the local thermal expansion coefficient and the local elasticity modulus, but also directly by the local temperature in the layer structure. In this way it is also possible to generate a desired stress distribution by generating a specific temperature distribution (e.g. using individually regulatable cooling zones) in the layer structure. For example, a single, very small area within the layer structure in the peripheral region of the wafer can be cooled to lower temperatures than the rest of the layer structure, and this leads to a local stress peak being generated here in the peripheral region. Needless to say, other geometries for such zones with different cooling are also possible and are in accordance with the invention. The targeted local introduction of a defined cooling capacity into the layer system is, moreover, facilitated if surface structural elements are made of a well thermally conductive and stable material, such as e.g. metal.

Moreover, it is not only the current temperature distribution in the layer structure that has an effect upon the current stress distribution, but also the temporal change in temperature. In particular, many material properties of the polymer are also dependent upon the rate of cooling: For example, very rapid cooling (with cooling rates over 10K/s) of specific regions may enable local stress peaks in the polymer layer.

In particular, additional external forces can also be exerted specifically upon defined regions of the layer system during the cooling process before separating the wafer in order to generate defined local stress peaks. For example, a needle-shaped metal tip can be pressed against the polymer film in the region of the wafer edge in order to generate a local stress peak in the layer system here. This embodiment is advantageous because it provides a great abundance of different effects in order to generate a break initiation point.

According to another preferred embodiment of the present invention a stabilisation layer is disposed over the receiving layer, by means of which a composite structure is formed and the local stress induction is brought about by at least one stress inducing means formed in the composite structure and which generates a stress peak in the layer of solid material to be separated such that the break initiation point is formed. This embodiment is advantageous because the stress inducing means can be configured, provided and tested as specified spatially and geometrically without a workpiece being required. Furthermore, this type of stress inducing means can particularly preferably be re-used.

For generation of thermally induced stress the wafer is preferably pre-cooled to a temperature at which a stress which comes beneath the limit stress is established. The material of the receiving layer or the polymer is advantageously below its glass transition temperature due to the pre-cooling. With the aid of an exposure device, in particular a laser, energy is applied to a specific point of the composite structure, in particular the wafer polymer composite, by means of a time-limited pulse—preferably in a locally limited part of the wafer edge. In addition or alternatively, the thermal stresses can be generated by very strong light and/or a (preferably small) heating point in the wafer's holder which can be made very hot very quickly and/or are generated by touching the wafer with a sufficiently hot object such as e.g. a hot rod and/or by a hot fluid, in particular a hot gas.

Alternatively, it is conceivable for energy to be extracted at a specific point of the composite structure, in particular the wafer/polymer composite e.g. with the aid of cold gas, in particular with nitrogen steam, preferably generated from liquid nitrogen, or e.g. directly with liquid nitrogen by means of a time-limited flow of steam or liquid—preferably in a locally limited part of the wafer edge. Cold gas can alternatively also be generated by the adiabatic relaxation of gases—the temperature must preferably be clearly below the glass transition temperature (e.g. 100 K), at least however 5K and preferably at least 25K and particularly preferably at least 50K below.

Thermal stresses resulting from the local heating or local cooling will exceed the required minimum limit stress for the removal of the wafer (for silicon the theoretical value is 1.7 GPa, and this is clearly reduced e.g. by doping and grid impurities and by non-ideal edge finishes) or stress increases can be established by the thermally induced stresses. In this way the crack is initiated directly and the splitting process begins. Typically, this ends after less than 1 ms. The method thus ensures that the splitting time is defined as soon as sufficient stress for the crack initialisation is expended or generated.

In addition or alternatively, utilisation of the inverse piezo effect is possible. That is to say, elastomers have piezoelectric properties, due to which the following structure can be chosen by utilising the inverse piezo effect.

The solid or wafer is pre-cooled to a temperature at which a stress is established which comes below the limit stress. The polymer is advantageously at below the glass transition temperature. At one point of the wafer (preferably at the edge) an electrode lies on the polymer and a second electrode touches the wafer. By applying sufficient stress the polymer can be made to contract and so the required limit stress is exceeded. This results in the crack also being initiated directly and the splitting process starting. Typically, this has also ended after less than 1 ms. The method therefore likewise ensures that the time of splitting is defined as soon as sufficient stress is expended in order to initialise the crack.

In addition or alternatively, stresses can be generated by means of sound waves which come above the limit stress. That is to say, sound waves can be used to introduce energy locally. In order to utilise sound waves the following structure is preferably chosen. The solid or wafer is preferably likewise pre-cooled to a temperature at which a stress which comes below the limit stress is established. The polymer is likewise advantageously at below the glass transition temperature. Sound waves are injected into the solid and/or the receiving layer or into the composite structure such that at one point sufficient energy is introduced (preferably at the edge) in order to exceed the required limit stress, by means of which in turn the crack is initiated in a temporally defined manner.

Temporally defined initiation of a crack in the solid offers considerable advantages in comparison to the methods known from the prior art, in particular within the industrial context, e.g. as regards process time reliability and quality management.

According to another preferred embodiment the stress inducing means is a local inconstancy or a locally tightly limited strong spatial change in the E modulus, the thermal expansion coefficient and/or the thickness of the stabilisation layer and/or the receiving layer. In particular, such inconstancies occur at the edges of the stabilisation layer and/or the receiving layer and can be specifically influenced by the choice of corresponding edge geometries.

According to another preferred embodiment the stress inducing means is a projection formed on the stabilisation layer and/or the receiving layer, in particular with a pointed end, or a recess formed in the latter.

In this regard it has been recognised that the reason for the break starting in the corner is that there could be local peaks in the mechanical stress field which are caused by the angular geometry of the layer system. Tests in which different geometries were investigated for the layer system applied to the wafer confirm this. Therefore, the breaks each preferably start in regions of the layer system with sharp edges and corners, and far less in areas with large curvature radii.

In one exemplary embodiment layer components with defined geometries are made of different materials which are characterised by different thermal expansion coefficients, are securely connected (e.g. by adhesion or lamination) to one another to form a layer structure at a higher temperature (e.g. between ambient temperature and 150°). The geometry of at least one of the components of the layer structure has at least one region here with sharp corners or edges (i.e. with very small local curvature radii). If this layer structure is then cooled after solidification, stress fields occur due to the different thermal expansions in the layer structure, definable local stress peaks occurring in at least one region. In the following it is described how this type of layer structure can be produced e.g. using pre-produced polymer films and structural elements made of metal of a specific form and can be used for the separation of wafers.

The receiving layer is preferably formed by at least one polymer, the at least one polymer or the polymer produced from a number of materials preferably being made or at least partially formed from one or more duroplasts and/or from one or more elastomers and/or from one or more thermoplasts and/or from one or more thermoplastic elastomers. The polymer thus preferably comprises at least one plastic, in particular at least one elastomer, in particular at least one silicone, in particular at least one RTV silicone and/or at least one HTV silicone, in particular at least one polydimethysiloxane (PDMS) or is preferably made of at least one plastic, in particular at least one elastomer, in particular at least one silicone, in particular at least one RTV silicone and/or at least one HTV silicone, in particular at least one polydimethylsiloxane (PDMS). Thus, a polydiorganosiloxane, for example, can particularly preferably be used as a polymer, e.g. polymethylsiloxanes (PDMS). In the following a film made of PDMS is preferably used as the polymer layer or receiving layer.

Aluminium plates are preferably described as structural elements or stabilisation layer/s and a thick wafer made of silicon is preferably described as a workpiece; however, other suitable polymers, structural element materials and workpieces (e.g. made of other materials such as gallium arsenide, germanium, gallium nitride, silicon carbide, sapphire, etc.) can also be used.

PDMS is preferably used to produce the polymer films. This is a two-component mixture that is cured thermally (preferred mix ratios between curing agents: base materials have ratios in particular of 1:30 to 1:3). Temperatures from ambient temperature up to approx. 200° C., preferably from ambient temperature up to approx. 120° C., are used for curing—depending on the curing time. Curing times are preferably between approx. 1-120 minutes (at high temperatures) and 1-6 days (at ambient temperature). Before curing, PDMS is a viscous liquid that is applied to a smooth surface (e.g. a mirror) e.g. by means of a casting process and is cured here to form a film. The film is then removed from this surface (e.g. mechanically), is optionally processed further and is then applied to the surface to be coated. Moreover, the finished film can already be inspected prior to application and its quality can be checked (e.g. using normal mechanical, optical or electrical measuring methods, etc.). In addition to the method described here for the production of film, many other methods are commonly used in the industry (e.g. production by means of extrusion) which can also be used for the present invention.

Structural elements or a stabilisation layer made of another material are then adhered to a first film produced in this way. In the following a plate made of aluminium is described as the structural element; however, structural elements made of other suitable materials (e.g. brass, steel, silicon, glass etc.) can also be used. Preferably, the thermal expansion coefficients of the film and the structural elements differ greatly (at least by a factor of 2 to 5). Aluminium, for example, has a thermal expansion coefficient that is smaller by approximately one to two orders of magnitude than PDMS. The structural elements and/or specific regions of the PDMS film are produced here in a pre-defined form, i.e. in particular with at least one sharp corner, projection or edge in order to generate the desired local stress peaks. In the exemplary embodiment described a metal plate, for example, is used, the area and form of which corresponds approximately to that of the wafer, the difference being that its edge at one point tapers to a sharp corner and everywhere else is rounded.

Good adhesion between the receiving layer or the film and the stabilisation layer or the structural elements is also important here because the connection between the structural element/s and the film must be able to withstand sufficiently large shearing forces for the separation and sufficiently large temperature variations for the thermal induction of the required stresses. The adhesion can be improved e.g. by mechanically roughening the metal surface, anodizing the aluminium, cauterizing processes, etc.

A polymer film, for example, in particular a thin PDMS film, can be used as an adhesive for adhering the film. The PDMS is preferably applied thinly (a few milliliters for a 6 inch wafer) in the liquid state here, preferably to both surfaces to be adhered. Then the film is placed over the metal plate and pressed on with a roller or cylinder applying slight pressure. By moving the roller to and fro the adhesive film is distributed beneath the film and air bubbles are removed. The adhesive can cure at temperatures between ambient temperature and approx. 200° C. The curing times vary dependently upon the curing temperature as with film production (see above). Alternatively to the method described, the film can also be adhered to the metal plate using other conventional methods, e.g. using a vacuum laminator. Furthermore, the film can also be connected directly (without adhesive) to the surface of the metal plate, e.g. by means of "plasma activated bonding" (e.g. activation of the PDMS film in nitrogen plasma, pressing the film onto the metal plate, optionally "annealing") or e.g. by the lamination (melting on) of a thermoplastic film (e.g. Geniomer von Wacker silicones).

After adhering the receiving layer or the first polymer film to the stabilisation layer or the metal plate and after the curing of the adhesive, the workpiece (in the present example a thick silicon wafer) is adhered to the first polymer film by means of a similar method, and then a second, generally a thicker, polymer film is preferably adhered to the side of the wafer that is still free—in particular using a similar method. Finally, in the present example the lateral edges of all of the polymer films are trimmed so that they have the desired edge geometry.

Within the framework of an alternative process it is preferably also possible to adhere one or both of the polymer layers used not as a ready-made film, but to produce it/them directly in situ. For example, both the structural elements and the wafers can be cast directly with liquid PDMS with the aid of a shuttering device to form a composite structure.

Independently of the respective exemplary embodiment it is the case that: The required thicknesses and material properties (in particular thermal expansion coefficients and elasticity moduli) of the polymer layers used and of the metal plate or the structural elements depend upon the thicknesses and material properties of the workpiece and the desired target thickness of the wafer to be separated. With the examples of use described, a 400 micrometer thick, monocrystalline, pseudo-quadratic 6-inch silicon wafer with <100> orientation is preferably split in half into two 200 micrometer thick wafers. For this purpose the following thicknesses are particularly preferably used: The stabilisation layer or metal plate, in particular made of aluminium and between 0.5 and 5 millimeters thick, the receiving layer or the first polymer layer (between the metal plate and the workpiece), in particular between 0.2 and 5 millimeters thick, the second polymer layer, in particular between 0.2 and 10 millimeters thick. The lateral dimensions of the polymer layers correspond respectively to those of the wafer, in this exemplary embodiment the edges lying one over the other flush with the wafer edge. The lateral dimensions of the metal plate preferably also correspond, as mentioned, to those of the wafer, apart from the fact that preferably at least one or precisely one point of the edge tapers to a sharp corner of the metal plate and the rest of the peripheral regions are rounded.

After the metal plate with structural elements/polymer layer/workpiece/polymer layer layer system is produced, e.g. using one of the previously described exemplary embodiments, and the polymer is cured, as is normal in the Applicant's patent applications described in relation to the prior art, a thin wafer is separated from the workpiece, e.g. by thermally induced stresses, part of the layer structure (in the examples described the second polymer layer) still adhering to one side of the wafer. This layer structure can then be separated from the wafer produced e.g. by mechanical or chemical methods, as described in the aforementioned references. The other part of the layer structure with the structural elements (in the examples described the first polymer layer, and on the latter the metal plate) still adheres correspondingly on one side to the remaining workpiece. This part can also be separated e.g. by mechanical or chemical methods, as described in the aforementioned references or patent applications of the Applicant.

After the layer structure (with or without the structural elements connected) has been separated from the wafer produced, it can—if so desired—be cleaned and then be applied to a new workpiece. In this way it is possible to use the same layer structure (with or without the structural elements connected) a number of times in order to produce wafers. This can significantly reduce material consumption and the cost of the whole process. For re-use of the layer structure it is particularly advantageous to use a re-soluble adhesive in order to attach the workpiece because in this case, after the adhesive layer on the layer structure has dissolved, no adhesive residue remains.

In the exemplary embodiments described it is shown how mechanical stress peaks in layer structures consisting of polymer layers and structural elements made of other materials (in particular materials with substantially smaller thermal expansion coefficients than the polymers used, i.e. in particular metals) can be used to resolve the problems mentioned at the start in the production of wafers. In order to produce corresponding layer structures consisting of components each with different thermal expansion coefficients, one does not, however, necessarily have to combine different materials: It is e.g. also possible to produce polymer layers with different thermal expansion coefficients by processing the polymer used differently (in particular different curing). Moreover, the thermal expansion coefficient and the elasticity modulus of the polymer used is greatly dependent upon the temperature (with a distinct glass transition at approx. $-125°$ C. where e.g. the elasticity modulus increases by a number of orders of magnitude, while the thermal expansion coefficient decreases by approximately, substantially or precisely a factor of 4).

In additional or alternative exemplary embodiments stress distributions with defined local stress peaks are incorporated directly into the layer structure during production. This can be achieved, for example, as follows: Before e.g. a polymer layer (e.g. a ready-made polymer film) is connected (e.g. adhered) to another layer, a defined region of this polymer layer is exposed to defined mechanical pre-stressing, in particular with a local stress peak. This can take place, for example, by a region of the polymer film, prior to adhesion, being subjected to tensile stressing in one or more directions by defined external forces, for example by external mechanical pulling at the edges of the film or by external mechanical bending of the film. After the adhesive has cured, the outer forces are deactivated, but the layer composite remains under stress. Moreover, external forces can also be used to pre-stress any other components of the layer system: thus e.g. in order to generate local stress peaks, instead of or in addition to the polymer layer, regions of the wafer can also be subjected to tensile stress or be bent by external forces prior to adhesion.

According to another preferred embodiment of the present invention the stress inducing means extends with its longitudinal axis in the longitudinal direction and/or in the depth direction of the stabilisation layer. This embodiment is advantageous because the stress inducing means can be used at will for the defined stress induction by means of the respective alignment of its longitudinal axis.

According to another preferred embodiment of the present invention, a number of stress inducing means are formed on the stabilisation layer in the circumferential direction of the stabilisation layer or the metal plate. This embodiment is advantageous because break initiation points can be generated at a number of points on the wafer edge at the same time or staggered in time.

According to another preferred embodiment of the present invention the stress inducing means is a projection formed on the receiving layer or the polymer layer or a recess formed in the latter. This embodiment is advantageous because the polymer layer preferably rests directly against the workpiece and so stresses brought about by the geometry of the polymer layer are generated directly in the workpiece.

According to another preferred embodiment of the present invention, the local stress induction is brought about by means of a pulse emitting device, the pulse emitting device emitting waves, in particular sound waves or light waves. This embodiment is advantageous because the pulse strength, the pulse frequency, the pulse duration and/or pulse direction can preferably be adjusted.

According to another preferred embodiment of the present invention a number of pulse emitting devices are arranged in the circumferential direction of the workpiece and stresses are induced by means of the pulse emitting devices at a number of points provided in the circumferential direction of the workpiece. This embodiment is advantageous because any number of break initiation points can be generated at the same time or staggered in time.

According to another preferred embodiment of the present invention the local stress induction is brought about by means of a stress inducing means and a pulse emitting device, the stress inducing means being formed by a geometric configuration of the composite structure, and the pulse emitting device emitting waves, in particular light waves or sound waves. This embodiment is advantageous because a first stress can be generated in the workpiece, e.g. by means of the stress inducing means, and a second or additional stress or stress increase can be brought about by the pulse emitting device. The pulses emitted by the pulse emitting device can therefore preferably be understood as break initiating pulses, and the stresses induced by the stress inducing means can preferably be understood as basic stresses.

According to another preferred embodiment of the present invention, the local stress induction by means of the stress inducing means and the pulse emitting device take place at least at times and preferably always at the same time or staggered in time.

The temporal interplay of the external forces is, furthermore, to be considered along with the sequence of the cooling process because this is also of great significance: Since essential material properties such as e.g. elasticity moduli of the polymer layers take on substantially different values above the glass transition temperature than below the glass transition temperature, it is important for the stress distribution whether external forces are exerted only above or only below the glass transition or at all temperatures. Moreover, material properties, such as elasticity moduli, in particular in the polymer, can also be influenced by exerting external forces (e.g. the molecular chains of the polymer can be aligned along the external forces, and so the polymer becomes anisotropic).

Stress peaks can be defined not only spatially, but also temporally. For example, external forces can be exerted upon the layer system as a temporally narrowly limited pulse, for example also as a sound pulse. Or, for example, a specific region of the layer system can be cooled temporally very quickly (abruptly). Furthermore, it is conceivable for stress peaks to be combined and defined spatially and temporally. This embodiment is advantageous because in this way the time of the break initiation can be influenced or controlled.

According to another preferred embodiment of the present invention the local stress induction is brought about by the stress inducing means over a longer time than by the pulse emitting device, the pulse emitting device being controlled in particular dependently upon the stress inducing means. This embodiment is advantageous because the stresses induced by the different devices/means can thus be matched optimally to one another.

Furthermore, according to another preferred embodiment of the present invention, pre-defined stress distribution within the workpiece is induced in order to influence, in particular to specify in a defined manner, a separation sequence when separating the layer of solid material from the workpiece, and the layer of solid material is separated from the workpiece along a plane extending within the workpiece according to the separating sequence influenced by the pre-defined stress distribution. This embodiment is advantageous since by means of the controlled or manipulated or influenced crack propagation, advantageous effects with regard to the thickness of the layer of solid material can be brought about.

According to another preferred embodiment of the present invention, the pre-defined stress distribution constitutes stress distribution according to which the stress intensity within a plane of the workpiece passing from the centre of the workpiece towards the peripheral regions of the workpiece is at least partially different, the stress intensity in the centre of the workpiece preferably being greater than close to the peripheral regions of the workpiece. This embodiment is advantageous because it also has a positive effect upon the crack propagation, by means of which very homogeneous layers of solid material can be generated.

According to another preferred embodiment of the present invention the receiving layer preferably comprises a polymer or is made at least partially and particularly preferably entirely of a polymer, when exposing the composite structure, that preferably consists at the very least of the receiving layer and the workpiece, to an inner and/or outer stress field, at least one part, and preferably a number of parts of the polymer, in particular PDMS, undergoing precisely one glass transition, at least one glass transition or a number of glass transitions, in particular temporally staggered glass transitions. It is conceivable here for the initiation of the glass transition to be brought about as a result e.g. of mechanical and/or chemical and/or thermal and/or acoustic effects or exposures.

According to another preferred embodiment of the present invention, by tempering the receiving layer basic stresses in the workpiece are generated, the basic stresses being smaller than the stresses required for crack initiation and an additional local increase in stress being brought about by the pre-defined local stress induction in the peripheral region, by means of which the break is initiated, a period of time between generating the basic stresses and the local stress induction being specified or set in a defined manner. This solution is advantageous because the intensity of the basic stresses can be set very precisely below the stress intensity required for the crack initiation, and after setting the basic stresses the crack initiation can initiate a crack or break, preferably at any time, by means of a further pulse, in particular local exposure of the workpiece in the peripheral region. Since the intensity of the crack initiation stresses is preferably greater than the intensity of the crack guiding stresses, by means of this solution, for example, no stresses induced over the whole surface need be generated in the region of the crack initiating stresses, by means of which clearly more precise crack guidance is made possible because overall clearly less energy is introduced into the workpiece.

Furthermore, a result of the preferably temporal staggering of the basic stress generation and the local stress induction is that the basic stresses can first of all be generated in a defined manner and at a preferably downstream point in time the additional stresses required to initiate a crack are generated locally. For example, the basic stresses are generated by the tempering, in particular the cooling of the receiving layer, and one, two, three or more seconds later, fractions of this also being conceivable (such as e.g. 0.1 secs, or 1.25 secs, or 0.001 secs), generation of the local stresses is brought about by means of exposing the composite structure, in particular the workpiece, to locally introduced forces, local tempering, in particular cooling or heating, local exposure to waves, in particular sound waves or light waves, local exposure to fields, in particular electromagnetic fields, local exposure to electricity, in particular utilising the inverse piezo effect, and/or local exposure to radiation from a radiation source, by means of which the crack or break is initiated.

The present invention also relates to a device for the production of layers of solid material, in particular wafers. The device according to the invention comprises at least one means for inducing defined local stresses in a peripheral region of a workpiece in order to generate a break initiation point in the workpiece in order to separate a layer of solid material from the workpiece, the device having a base body that has a substantially level surface for receiving the layer of solid material, and a stress inducing means being formed on the base body and extending with its longitudinal axis in the longitudinal direction of the base body or in the depth direction of the base body.

The present invention can, furthermore, relate to a wafer that is produced by the method according to the invention or by the device according to the invention.

Furthermore, the subject matter of publications PCT/US2008/012140 and PCT/EP2009/067539 is made complete by reference to the subject matter of the present patent application. Likewise, the subject matter of two further patent applications also submitted on the application date of the Applicant's present patent application and relating to the domain of the production of layers of solid material are made complete by the subject matter of the present patent application.

The use of the word "substantially" in all cases where this word is used within the framework of the present invention preferably defines a deviation in the range of 1% to 30%, in particular of 1% to 20%, in particular of 1% to 10%, in particular of 1% to 5%, in particular of 1% to 2% from the specification which was given without using this word.

Further advantages, aims and properties of the present invention are explained by means of the following description of the attached drawings in which wafers, carrier units and devices according to the invention are shown as examples. Components or elements of the wafers, carrier units and devices according to the invention which correspond at least substantially with regard to their function in the figures can be identified here by the same reference signs, these components or elements not necessarily having to being numbered or illustrated in all of the figures.

Individual or all of the illustrations of the figures described below are preferably to be considered as design drawings, i.e. the dimensions, proportions, functional relationships and/or arrangements shown by the figure or figures preferably correspond precisely or preferably substantially to those of the device according to the invention or the product according to the invention.

BRIEF DESCRIPTION OF THE DRAWINGS

The figures show as follows:

FIG. 1a a first diagrammatic illustration of a layer arrangement according to the subject matter of the present invention;

FIG. 1b a second diagrammatic illustration of a layer arrangement according to the subject matter of the present invention;

FIG. 2a a first defined stress sequence within a first preferred basic form of a workpiece;

FIG. 2b a second defined stress sequence within the first preferred basic form of a workpiece;

FIG. 2c a third defined stress sequence within the first preferred basic form of a workpiece;

FIG. 2d a fourth defined stress sequence within the first preferred basic form of a workpiece;

FIG. 2e a fifth defined stress sequence within the first preferred basic form of a workpiece;

FIG. 2f a sixth defined stress sequence within the first preferred basic form of a workpiece;

FIG. 3a another defined stress sequence in a second preferred basic form of the workpiece;

FIG. 3b yet another defined stress sequence in the second preferred basic form of the workpiece;

FIG. 3c yet another defined stress sequence in the second preferred basic form of the workpiece;

FIG. 3d yet another defined stress sequence in the second preferred basic form of the workpiece;

FIG. 3e yet another defined stress sequence in the second preferred basic form of the workpiece;

FIG. 5a the application of stresses to a workpiece by means of a pulse emitting device;

FIG. 5b a stabilisation layer that has two different stress inducing means;

FIG. 5c an enlarged illustration of the region B identified in FIG. 5b;

FIG. 5d a side view of the region B shown in the top view in FIG. 5c;

FIG. 6a a top view of different stress states in the workpiece;

FIG. 7a another embodiment of a stabilisation layer;

FIG. 7b other stress states in the workpiece;

FIG. 9a a diagrammatic top view of a multi-layered structure which comprises a receiving layer, a stabilisation layer and the workpiece;

FIG. 9b a side view of the multi-layered structure from FIG. 9a along section S shown in FIG. 9a;

FIG. 9c an enlarged illustration of the circularly marked region in FIG. 9b;

FIG. 11a a diagrammatic illustration of an embodiment according to which the stress inducing means is in the form of a recess in the receiving layer; and FIG. 11b a diagrammatic illustration of an embodiment according to which the stress inducing means is in the form of a recess in the stabilisation layer.

DETAILED DESCRIPTION

Figure 1C:
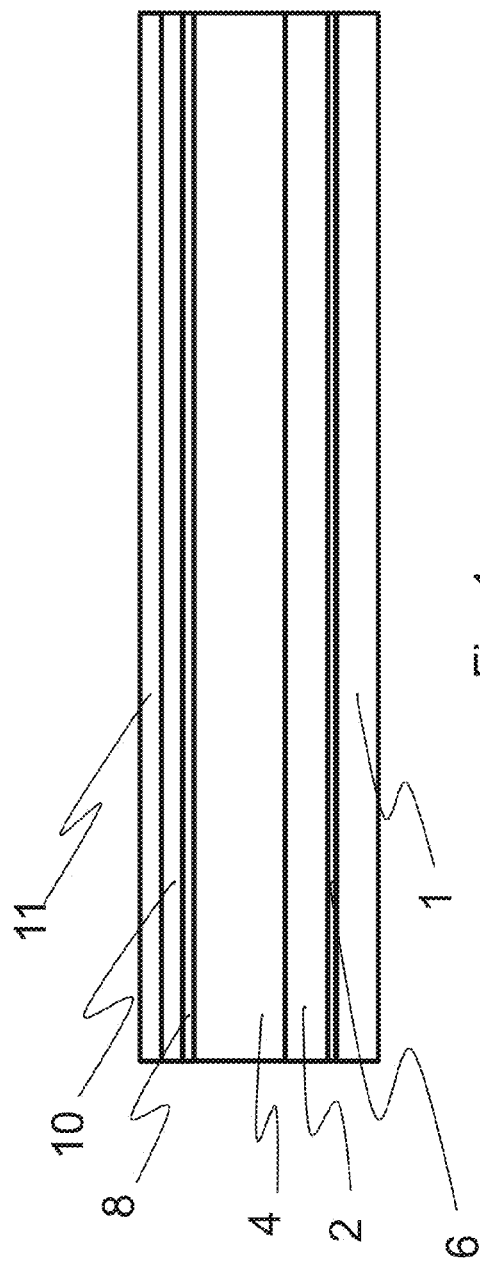
FIG. 1c a third diagrammatic illustration of a layer arrangement according to the subject matter of the present invention.

In FIG. 1a a first diagrammatic cross-sectional illustration of the layer structure according to the invention is shown. According to this illustration the layer structure has at least one stabilisation layer 1, a receiving layer 2 disposed over, against or on the latter, and a workpiece 4 disposed over, against or on the latter, in particular a thick silicon disc.

The individual layers 1, 2, 4 can extend here over the same distance in the X, Y and Z direction, it also being conceivable for only individual layers to extend over the same distance in one or a number of directions. Preferably, the individual layers 1, 2, 4 respectively extend over different distances, at least in the Z direction.

In FIG. 1b, the layer structure shown in FIG. 1a is supplemented by an adhesive layer 6 that is formed between the stabilisation layer 1 and the receiving layer 2. The adhesive layer 6 can be used to connect the stabilisation layer 1 to the receiving layer 2. However, embodiments are conceivable in which one can dispense with an adhesive layer 6.

In FIG. 1c, the layer structure shown in FIG. 1b is supplemented by a connection layer 8, an additional receiving layer 10 and an additional layer 11. The connection layer 8 preferably acts as the adhesive layer 6 here and connects the additional receiving layer 10 to the workpiece 4. Furthermore, there is preferably connected to the additional receiving layer 10 an additional layer 11 which can particularly preferably be made as an additional workpiece 4 or as an additional stabilisation layer.

Furthermore, it is conceivable for an additional adhesive layer to be provided between the additional receiving layer 10 and the additional layer 11. It is likewise conceivable for the connection layer 8 only to be provided as an option.

Figure 1D:
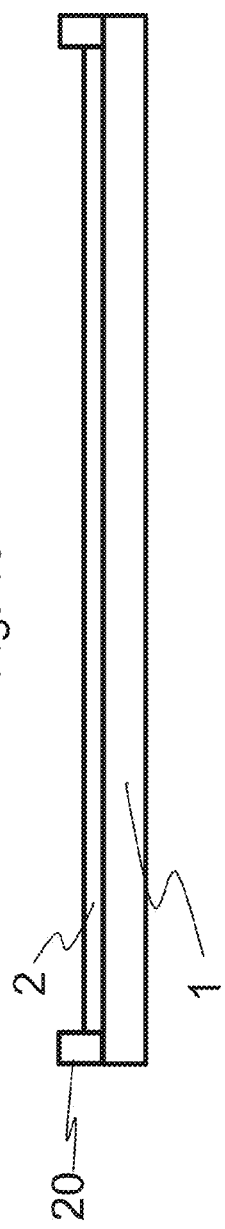
FIG. 1d a first diagrammatic illustration of the production of a receiving layer over a stabilisation layer.

In FIG. 1d a stabilisation layer 1 is shown on which a mounting 20 is disposed. The mounting 20 preferably extends entirely in the circumferential direction of the stabilisation layer 1 and can particularly preferably be brought into contact with the stabilisation layer 1. According to the illustration of FIG. 1d the inner diameter of the mounting 20 is smaller than the outer diameter of the stabilisation layer 1. The internal space defined by the mounting 20 and the stabilisation layer 1 serves to accommodate pourable, in particular liquid material. The material solidifies after being introduced into the internal space such as to form a substantially or exactly level layer, in particular the receiving layer 2.

Figure 1E:
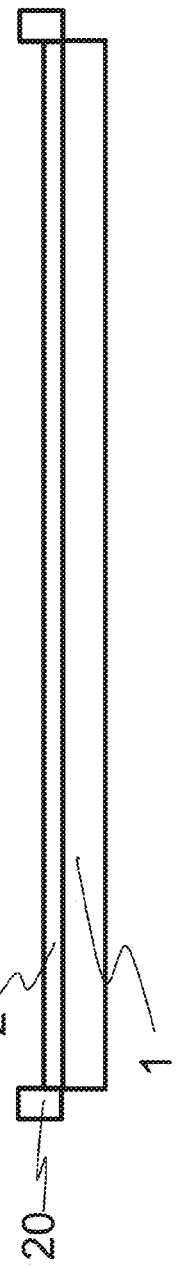
FIG. 1e a second diagrammatic illustration of the production of a receiving layer over a stabilisation layer.

According to FIG. 1e the mounting 20 is larger than in the embodiment shown in FIG. 1d, by means of which the receiving layer 2 produced over the stabilisation layer 1 preferably substantially and particularly preferably completely overlaps the surface of the stabilisation layer 1 extending in the X/Y plane.

In FIGS. 2a-2f various defined stress fields 14 are shown, the stress fields shown only being intended to be considered as examples because any other combinations of the stress fields shown and/or differently shaped stress fields can be provided. The basic form of the workpiece shown can additionally also vary, the basic form of the workpiece (in particular in the X/Y plane) preferably being symmetrical. Purely as an example, the basic form of the workpiece is shown pseuoquadratically.

In FIG. 2a stress distribution 14 marked by the hatching is introduced in a peripheral region 12 of the workpiece 4. According to the subject matter of the present invention crack propagation upon separating a layer of material from the workpiece 4 can be influenced or controlled in a particularly advantageous manner on the basis of the locally anticipated defined stress distribution/s 14.

According to illustration 2b the stress distribution is induced inversely to the stress distribution in the workpiece 4 shown in FIG. 2a. It is conceivable here for the stress to be substantially homogeneous within a defined stress range 14. However, it is also conceivable for the stress to vary greatly within a defined stress range 14, and in particular to have a multiple of the stress of another region exposed to stresses in some parts.

In FIG. 2c stress distribution is shown that has a number of annular or partially annular portions 14a and a disc-shaped portion 14b. It is conceivable here for portions extending in a planar and/or linear manner, in particular in a straight line, to be able to be induced in addition or alternatively to individual or to all of the portions 14a, 14b shown.

In FIG. 2d stress distributions 14c extending at least partially or preferably entirely in a straight line are shown. The number of stress distributions 14c extending in a straight line can, as shown, be exactly 5, preferably any number—also differently formed stress distributions—, in particular 1, 2, 3, 4, 5, 6, 7, 8, 9, 10 or more different stresses, being able to be induced. The individual stress distributions 14 can be induced at constant distances from one another, particularly preferably being able to be induced at any distances from one another. Preferably, the induced stresses 14c increase or decrease from the edge of the workpiece 4 towards the centre of the workpiece 4. This is shown in particular by the areas of the individual stress fields 14c increasing the closer they are to the centre of the workpiece 4. In addition or alternatively it is conceivable for the stress fields to have similar or equal area sizes, but to differ from one another as regards the induced stress intensity. It is also conceivable for the stresses to decrease towards the centre.

In FIG. 2e stress distribution is shown the intensity of which increases in stages from the edge of the workpiece towards the centre of the workpiece. It is also conceivable, however, for the stress intensity to increase continuously.

In FIG. 2f a basic stress is induced in the peripheral region 12 of the workpiece 4. Furthermore, locally defined further stress distributions 14d, 14e are induced. Similarly to FIGS. 2a and 2b, the stress distribution shown in FIG. 2f can also be induced inversely.

In FIGS. 3a-3e additional locally defined stress distributions are shown in the workpiece 4. The features and/or properties described in relation to FIGS. 2a-2f can be combined with the features and/or properties of the stress distributions shown in FIGS. 3a-3e and described below (this also applies vice versa). The basic form of the workpiece is shown to be round according to these figures.

In FIG. 3a a number of annular stress distributions 14a are shown. It is conceivable here for the stress distributions 14a to be non-annular or only partially annular in form, and preferably a spiral-shaped stress distribution can also be induced partially or totally.

In FIG. 3b a substantially planar or disc-shaped stress distribution 14b is induced, the stresses in the region of two defined sections being induced less strongly. It is conceivable here for the stresses to be induced less strongly in just one section. Furthermore, it is conceivable for the stresses to be induced less strongly in a plurality of sections. Here the sections can, as shown, extend in an elongate manner, in particular in a straight line, or have a form different from this, in particular a spherical form.

In FIG. 3c a first stress distribution 14 and an additional stress distribution 14d is in turn induced. The additional stress distribution 14d is preferably partially annular in form and particularly preferably extends along the outer edge of the workpiece. Preferably, the stresses 14d overlap the stresses 14 or vice versa.

In FIG. 3d the annular stress distribution is induced less strongly in places.

The stresses can preferably be induced depending on the area of application, and particularly preferably on all workpieces at the edge of the workpiece, in the middle of the workpiece and/or in a region between the edge or an outer edge of the workpiece and the middle or the centre of the workpiece.

Preferably, the induced stress decreases from the centre of the workpiece 4 towards the outer edge of the workpiece 4. This is shown here by narrower stress fields.

In FIG. 3e stress distribution is shown the intensity of which increases in stages from the edge of the workpiece towards the centre of the workpiece. However, it is also conceivable for the stress intensity to increase continuously or for the stress intensity to decrease in stages or continuously towards the centre of the workpiece.

Figure 4:
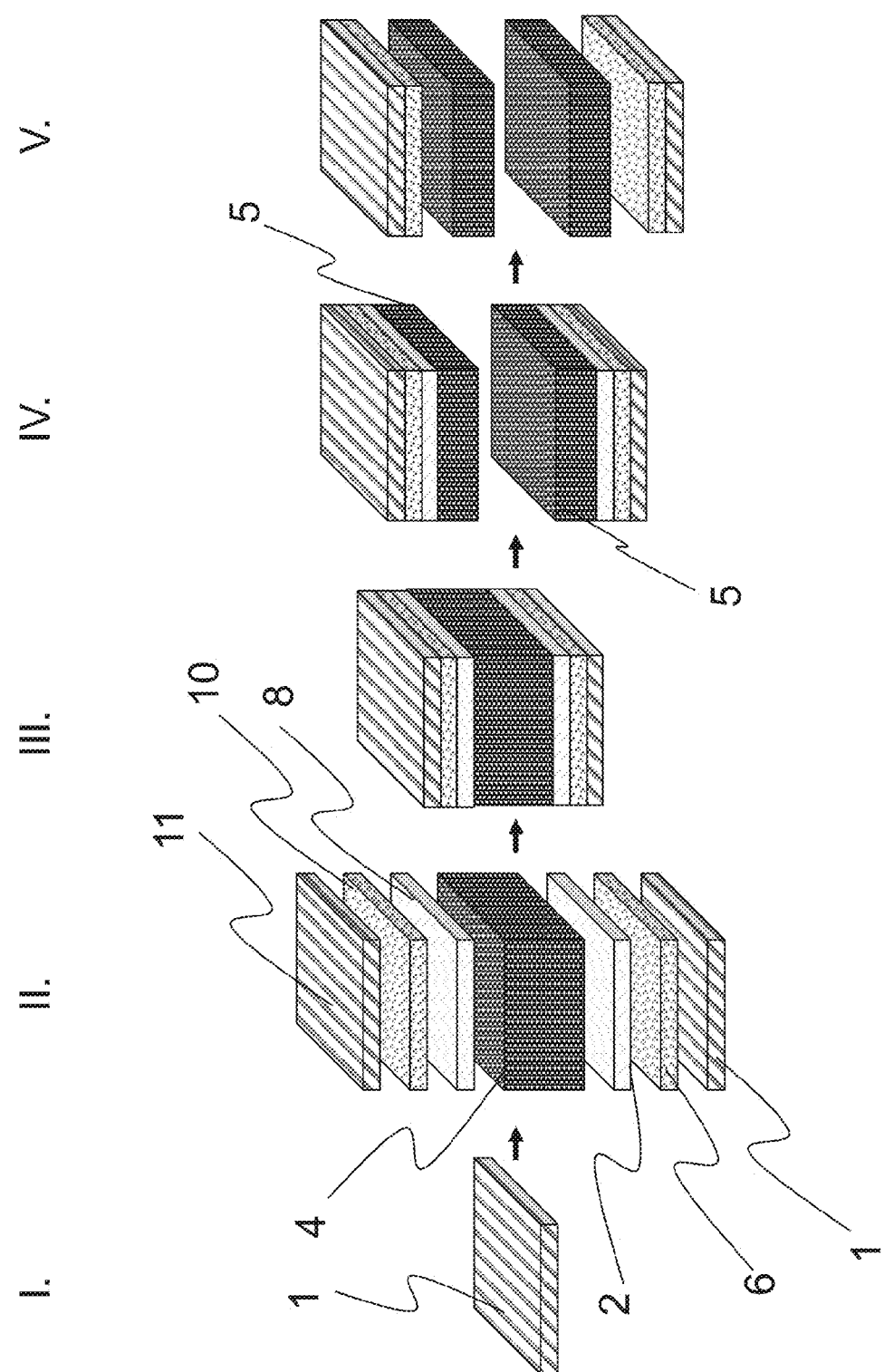
FIG. 4 a diagrammatic illustration of a preferred sequence of the production method according to the invention.

In FIG. 4 the generation of individual layers of solid material from a workpiece in the form of individual silicon wafers is shown diagrammatically, which layers are separated including a pre-defined stress distribution such that an even thickness distribution of the separated wafer is produced. The pre-defined stress distribution can preferably be induced directly or indirectly, in particular by means of radiation sources. Radiation sources can be understood here to be thermal radiation sources such as heating devices or cooling devices, or other radiation devices. It is also conceivable for the stress distributions to be induced by heat conduction or convection into the workpiece. Heat radiation, heat conduction or convection can preferably be brought about through individual or through all of the layers or coatings 1, 6, 2 or 8, 10, 11. In addition or alternatively, however, it is also conceivable for the pre-defined stress distribution to be introduced directly or indirectly into the workpiece by applying a force or torque to one or more of the layers 1, 6, 2 or 8, 10, 11, i.e. for the stresses to be particularly preferably brought about by applying force or torque to one or more of the stabilisation layers 1, 11.

In a first step I the provision of a first layer, in particular the stabilisation layer 1, takes place, which layer is made of metal, and in particular of aluminium. Furthermore, it is conceivable for the additional layers 2, 4 to also be provided in this step.

In the second step II previously not yet provided layers are generated and/or connected to one another. Preferably, the individual layers are arranged as shown, i.e. an adhesive layer 6 (for example made of PDMS) is preferably applied to the stabilisation layer 1 in order to couple or connect a receiving layer 2 made of PDMS to the stabilisation layer 1. The receiving layer 2 is preferably directly in contact with a workpiece 4, it also being conceivable for a sacrificial layer or an additional adhesive layer to be provided between the receiving layer 2 and the workpiece 4.

The structure described above with the layers 1, 6 and 2 over the workpiece 4 can be applied in the same way to the other side of the workpiece 4 or alternatively can be applied in an altered form, as explained in the following. A connection layer 8, in particular in the form of an adhesive, is provided parallel to the receiving layer 2 and preferably also in contact with the workpiece 4. The connection layer 8 can be designed to connect an additional receiving layer 10 made of PDMS and/or an additional layer 11 to the workpiece 4. The additional layer 11 is preferably also made in the form of a stabilisation layer made of metal or of an additional workpiece, a corresponding layer structure composed of the layers 1, 6, 2 or the layers 8, 10, 11 in turn being able to be provided on the additional workpiece. The stabilisation layers 1 are preferably rigid or are made of rigid materials and enable mechanical coupling with an additional device for applying stress. The E modulus of the stabilisation layer 1 or stabilisation layers 1, 11 is therefore higher than the E modulus of the receiving layers 2, 10. Additionally or alternatively, the stabilisation layers 1 enable defined local thermal stressing of the workpiece.

In step III all of the layers are connected to one another or are already connected to one another.

In step IV the workpiece 4 is shown split into two parts, one part of which being connected to the layer arrangement 1, 6, 2, and the other part being connected to the layer arrangement 8, 10, 11. In the transition from step III to step IV stresses are produced in the workpiece 4, by means of which the workpiece 4 is split into a number of, in particular exactly two parts or layers of solid material. Preferably, mechanical stress is induced into the layer structure by applying forces to more rigid stabilisation layer/s 1, 11. The stress is extremely advantageously induced as a result of the described layer arrangement with layers 1, 6, 2 or 8, 10, 11 with different E moduli because the layers with lower E-moduli can rest against the workpiece 4 without causing any damage, and the layers 1, 11 with higher E-moduli can be coupled to additional devices in order to apply force.

In the optional step V the individual layers of solid material which have been obtained from the workpiece 4 are once again detached from the additional layers.

The method according to the invention can additionally or alternatively have one or all of the following steps here: providing a workpiece for the separation of the layers of solid material, the workpiece having at least one exposed surface, producing and/or providing a carrier unit for receiving at least one layer of solid material, the carrier unit being made in a number of layers, the carrier unit having a stabilisation layer and the stabilisation layer being overlapped at least partially by a receiving layer, the receiving layer being designed to hold the layer of solid material, and the stabilisation layer being at least partially formed such that it has an E modulus that is greater than the E modulus of the receiving layer, and connecting the receiving layer to the exposed surface of the workpiece, thus forming a composite structure or a laminate, and exposing the composite structure to an inner and/or outer stress field in such a way that the layer of solid material is separated along a plane of the workpiece extending within the workpiece.

According to one preferred embodiment of the present invention the receiving layer and the stabilisation layer are made of different materials, the receiving layer preferably comprising a polymer, in particular polydimethylsiloxanes (PDMS), and the stabilisation layer preferably comprising a metal, in particular aluminium.

With the present invention, i.e. in particular by using polymer/metal laminates as layer systems for generating thermally induced mechanical stress fields, all of the aforementioned problems and restrictions are eliminated. In the examples of use described here, a thicker wafer from which one or more thinner wafers are then separated using the described method is preferably used as the workpiece. This embodiment is advantageous because it makes it possible to greatly reduce the thickness variations by using layers of appropriately configured polymer/metal laminates instead of the pure polymer layers used according to the previous prior art. These layers consist e.g. of alternating layers of polymer and a metal, e.g. aluminium, the innermost layer, i.e. the layer lying closest to the wafer surface and generating mechanical stress, in each case preferably always being made of polymer. With the corresponding methods according to the invention described below, layers of solid material, such as in particular wafers, can be produced with far smaller total thickness variations (wafers with thickness variations <40% of the average wafer thickness have already been checked experimentally in this way), more advantageous linear patterns being able to be achieved as regards spatial thickness distribution, and in particular the regions with the greatest variations being able to be adjusted, such as e.g. being able to be brought close to the wafer edge where they are less disruptive.

In examples of use where the outermost layer of the laminate (i.e. the one furthest away from the wafer surface) is preferably made of metal, as a result of the good head conductivity of metals this has the additional advantage that very good thermal contact with the laminate is possible over this layer, and this enables efficient, locally well controllable and reproducible cooling of the laminate. Moreover, a metal layer or metal plate can generally be fastened more easily to a machine than the polymer layers used, and this facilitates the automated (subsequent) processing of the wafers. In addition, this fastening enables external mechanical forces to also be able to be exerted upon the laminate/wafer composite in a controlled manner by means of a machine, e.g. during the cooling process, by means of which the separation process can be further influenced. In particular, it is conceivable for the thickness of the wafers produced to be able to be influenced by the externally exerted forces as well as by the rigidity (elasticity modulus) of the layers involved, and all of these parameters can be controlled well and largely independently of one another when using the laminates according to the invention in large areas. Furthermore, it is particularly advantageous that the stress distributions can be pre-specified in a locally defined manner on the basis of the laminate structure according to the invention, i.e. the use of at least one metal layer, a polymer layer and the workpiece by means of the forces exerted and/or the rigidity of the layers involved, additionally or alternatively non-homogeneous temperature distribution in the workpiece or the laminate layers providing the pre-defined stress distribution.

In FIG. 5a a diagrammatic illustration of a workpiece 4 is shown. In the workpiece 4 pulses 23, in particular in the form of waves, are emitted by means of a pulse emitting device 22. The pulses 23 bring about local stresses 26 in the peripheral region of the workpiece 4 and at a place where a break initiation preferably takes place in order to separate a layer of solid material from the workpiece 4. The local stresses 26 therefore particularly preferably strike at the point on the peripheral region of the workpiece or on its circumference at which the break initiation point 44 is desired or provided.

In FIG. 5b two examples of stress inducing means 24, 25 are shown. According to this illustration both stress inducing means 24, 25 are made in the form of projections or elevations. The stress inducing means 24 extends over the circumference of an outer contour preferably uniformly bordering the stabilisation layer 1. Preferably, the surface of the stress inducing means 24 that can be brought into contact with a receiving layer 2 is made level and particularly preferably extends in the same plane as the remaining surface portion of the stabilisation layer 1. The stress inducing means 24 preferably has an end 46 that tapers. The tip 46 can preferably be pointed or linear in form here. The dashed line marked by the letter L preferably specifies the direction of extension in which the stress inducing means 24 extends with its longitudinal axis. It can be gathered from this illustration that the longitudinal axis L of the stress inducing means 24 extends in the X/Y plane.

The second stress inducing means 25 shown diagrammatically in FIG. 5b is formed on the surface of the stabilisation layer 1 with which the stabilisation layer 1 is connected to the receiving layer 2.

Thus, one exemplary embodiment of the invention consists of locally controlled stress peaks being generated in the layer structure by specifically choosing the layer geometry. For example, sharp corners and edges in the polymer layer 2 lead to local mechanical stress peaks, whereas rounded edges reduce these. For example, a local jump in the thickness of one of the layers 1, 2 in the layer system can lead to a local stress peak.

Reference sign B labels a region shown by dashes in which the additional stress inducing means 25 is disposed and which is shown, enlarged, in FIG. 5c.

It can be gathered from FIG. 5c that the stress inducing means 25 is disposed precisely at the edge of the stabilisation layer 1. However, it is also conceivable for the stress inducing means 25 to be a radial distance away from the circumferential edge of the stabilisation layer 1 or to extend over the circumferential edge.

In FIG. 5d it is shown that the stress inducing means 25 tapers or runs to a point at one end. Furthermore, it can be gathered from this illustration that the longitudinal axis L of the stress inducing means 25 extends in the Z direction.

The stress inducing means 24 and 25 can be provided individually or in combination. It is therefore conceivable for two stress inducing means, in particular two different types of stress inducing means 24, 25, to be directly adjacent to one another or spaced apart from one another by the maximum distance on one layer 1, 2 or on both layers 1, 2.

Different stresses or stress distributions are shown in FIG. 6a. On the one hand an increase in stress from the edge of the workpiece to the centre of the workpiece is identified by area portions 14a, 14d that become darker, and on the other hand locally induced stresses in the peripheral region are indicated by the black areas 26, 28, 30. With regard to the stresses that increase from the edge of the workpiece towards the centre of the workpiece, reference is made in particular to the comments made with regard to FIGS. 2a-3e. The locally induced stresses 26 are generated by exposing the workpiece 4 to pulses which are emitted by a pulse emitting device 22. The stresses 28 and 30 are generated by stress inducing means 24, 25 arranged on a stabilisation layer 1 that is not shown, in particular according to FIG. 5b. However, it is also conceivable here for just one of the locally defined stress fields 26, 28, 30 to be generated or for any combinations of these stresses or stress fields 26, 28, 30 to be generated on the edge of the workpiece 4.

It can be gathered directly from FIG. 6b that the locally defined stresses introduced by different stress inducing devices 24, 25 can be introduced partially, entirely or exclusively into the same region 26, 28 of the wafer. The stresses introduced into the same region 26, 28 can overlap partially or totally and/or can be introduced into the workpiece 4 partially or entirely staggered in time.

In FIG. 7a another diagrammatic illustration of a stabilisation layer 1 given purely as an example is shown. The stabilisation layer 1 has a plurality of stress inducing devices 24 preferably arranged equal distances apart in the circumferential direction of the stabilisation layer 1. It is conceivable for the stabilisation device 1 to have precisely or at least 1, 2, 3, 4, 5, 6, 7, 8, 9 or 10 stress inducing devices 24 of the same or different types.

In FIG. 7b an example of a number of induced stresses 26, 28 which are introduced by different types of stress inducing devices 22, 24 is shown. The stresses 28 are preferably generated by the stress inducing means 24 of the stabilisation layer 1 shown in FIG. 7a. The stresses 26 are preferably generated by the pulses 23 that are generated by the pulse emitting devices 22. The reference sign 24 identifies the break initiation point/s that are preferably located in the region or at the point of the stresses introduced in a defined manner into the peripheral region or the edge of the workpiece 4. The forms of the local stresses 26, 28 shown are to be understood purely as examples and may therefore differ from the forms shown. Additionally, it is conceivable for the locally defined stresses to be substantially punctiform, linear, planar or voluminar.

Furthermore, it is shown in FIG. 7b, purely as an example, that the pulses 23, 32 emitted by the pulse emitting devices 22 or the stresses 26, 28 brought about by the pulses 23, 32 can be different. It is conceivable here for the emitted pulses 23, 32 to be able to be characterised by different intensities, wavelengths etc. It is likewise conceivable for the stresses 28 in the workpiece 4 generated by the stress inducing means 24, 25 to be able to have values, in particular intensities, of different strengths.

Figure 8B:
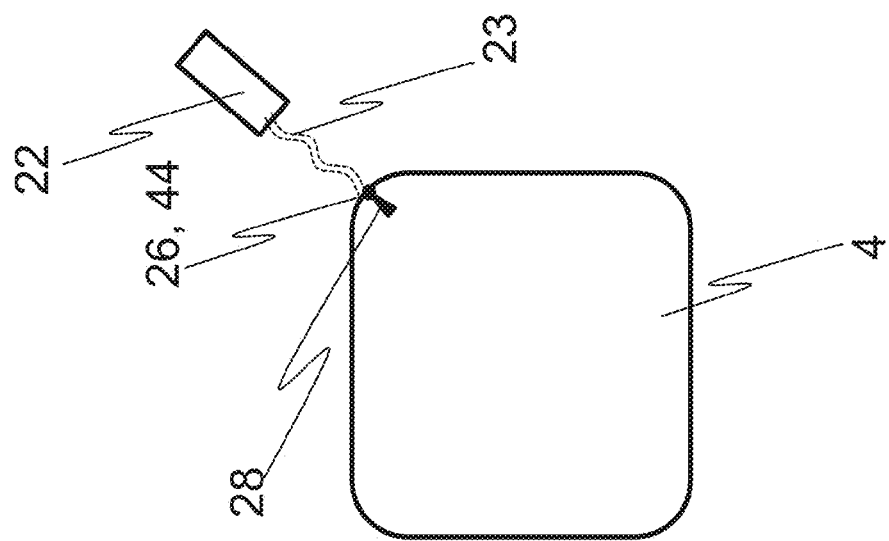
FIG. 8b other stress states in the workpiece.
Figure 8A:
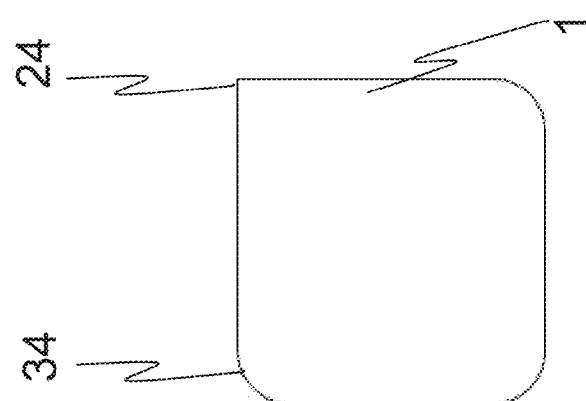
FIG. 8a yet another embodiment of a stabilisation layer.

In FIG. 8a another basic form of a stabilisation layer 1 is shown as an example. The stabilisation layer 1 is substantially rectangular, in particular square, in the case shown three corners 34 being rounded in form and one corner tapering. The tapering corner can be considered here to be a stress inducing means 24. It is also revealed by this illustration that the radii of the rounded corners 34 are a multiple greater than the radius of the non-rounded corner 24. In addition or alternatively it is conceivable for one or more stress inducing means 24, 25 to be able to be formed or provided in the region of the body edge of the stabilisation layer 1 extending in an elongate manner, in particular in a straight line. The configurations described with regard to the stabilisation layers 1 shown in FIGS. 5a to 7b and preferably substantially round in form can particularly preferably be used similarly to the embodiment shown in FIG. 8a and vice versa.

In FIG. 8b a configuration that is substantially the same as FIG. 6b is shown. The stresses 28 are induced in the workpiece 4 e.g. by the stabilisation layer 1 shown in FIG. 8a. Additionally or alternatively to this, additional stresses 26 are induced into the workpiece, in particular at the same point, by means of the pulse emitting device 22. The point at which the stresses 26 and/or 28 are induced is particularly preferably a pre-defined break initiation point 44.

A multi-layered arrangement is shown diagrammatically in FIG. 9a. The multi-layered arrangement preferably comprises a stabilisation layer 1, a receiving layer 2 and the workpiece 4.

Furthermore, a section S is shown, the sectional areas resulting from the section S being shown in FIG. 9b. In FIG. 9b a dashed circle is shown that shows a stress inducing means 25. According to this embodiment the stress inducing means 25 is formed by the interaction between a projection 38 formed on the stabilisation layer 1 or metal plate and a reduced thickness portion 40 formed in the receiving layer 2 or polymer layer. However, it is also conceivable here for the reduced thickness portion 40 to be made in the form of a recess 40 in the stabilisation layer 1 and for the projection 38 to be formed in the receiving layer 2. This configuration can e.g. cause the stresses induced in the workpiece 4 in the region of the projection 38 or of the reduced thickness portion 40 to have a local stress peak. Moreover, this configuration can e.g. cause cold/heat transferred onto the receiving layer 2 by means of the stabilisation layer 1 in the region of the projection 38 or the reduced thickness portion 40 to have a more rapid and/or more intense effect upon the receiving layer 2. Due to the reduced thickness portion 40 the insulation effect brought about by the receiving layer 2 can preferably be reduced or adjusted locally.

Furthermore, only one or precisely one stress inducing means 25 can be gathered from this illustration. However, it is conceivable for additional similar or different types of stress inducing means 24, 25 to be able to be provided.

Figure 10:
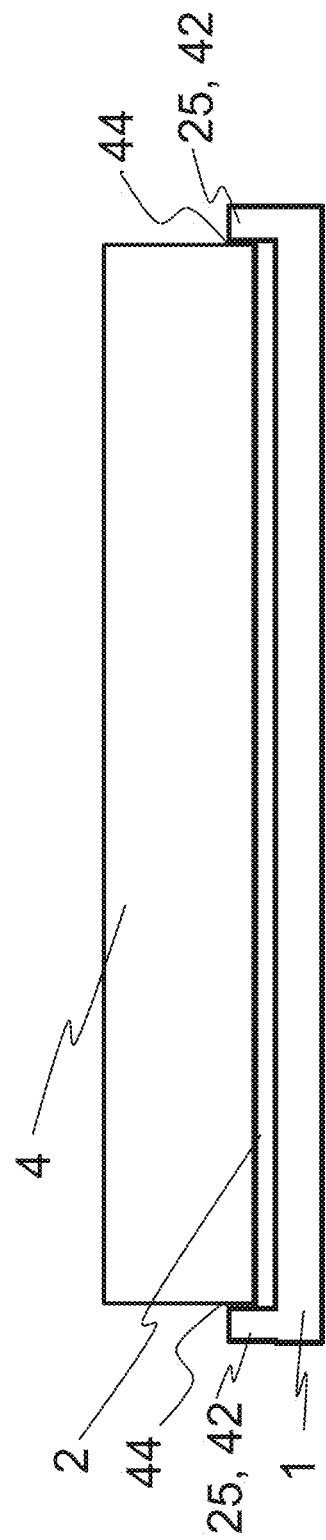
FIG. 10 a diagrammatic illustration of an embodiment according to which the stress inducing means partially overlaps the outside of the workpiece.

In FIG. 10 another embodiment of the present invention is shown diagrammatically. According to this embodiment stress inducing means 25 formed on the stabilisation layer 1 in the form of at least two or a plurality of stress including projections 42 extend at least partially over the outer circumference of the workpiece 4. It is conceivable here for there to be provided in addition to the two stress inducing projections 42 shown additional, in particular 3, 4, 5, 6, 7, 8, 9, 10 stress inducing projections 42 or only one or precisely one stress inducing projection 42. Alternatively, it is conceivable for one stress inducing projection 42 to be made in the form of a circumferential ring or collar. In addition or alternatively it is conceivable for the receiving layer 2 or the polymer layer to be configured such that it forms stress inducing projections (similarly to those described above).

The stress inducing projections 42 are preferably configured and positioned such that they can serve to induce defined local stresses at points, in particular surface portions in the peripheral area of the workpiece 4 or precisely at the edge of the workpiece 4 at which a break initiation is to be brought about.

Furthermore, it is conceivable for the projections 42 to be designed as circumferentially formed collars. The resulting pan-like receiving region can be employed or used similarly to the embodiment described in FIG. 1d or 1e, i.e. the receiving layer 2 can be produced by liquid polymer, in particular PDMS, being poured in and being used as an adhesive before completely curing in order to be applied to the workpiece. During the cooling process the circumferential collar, or in particular a peripheral line of the collar which rests against the workpiece, can define a circumferential break initiation plane in the form of a plurality of break initiation points.

The stress inducing projections 42 or the circumferential collar are preferably made of the same material from which the stabilisation layer 1 is made, or they are preferably a once-piece component connected to the latter. At least in the exemplary embodiment shown, the stabilisation layer 1 is particularly preferably made of metal, in particular aluminium. By tempering the metal plate 1 and by means of the tempering of the stress inducing projections 24 or of the collar that takes place in this way, the peripheral region of the wafer can be tempered, in particular cooled, locally, in particular substantially in a punctiform or linear manner.

In FIG. 11a another embodiment is shown according to which a stress inducing means 27 is made in the form of a recess 40 in the receiving layer 2 or the polymer layer. The recess 40 is preferably provided precisely on the edge of the receiving layer 2. Furthermore, in this figure a blast freezing device 48 is shown. With the blast freezing device 48 the receiving layer 2 can preferably be cooled rapidly locally, in particular in the region of the stress inducing means 27, and/or the workpiece 4, in particular in the peripheral region. The blast freezing device 48 can e.g. provide liquid nitrogen that is in particular metered, can be applied or is directly sprayed onto the respective region of the receiving layer 2 and/or the workpiece 4 to be blast frozen.

In FIG. 11b it is shown that additionally or alternatively, in particular similarly to the embodiment shown in FIG. 11a, a stress inducing means 27 in the form of a recess 40 in the stabilisation layer 1 can be provided.

In the embodiments shown in FIGS. 11a and 11b it is conceivable for the number of recesses 40 to be able to be chosen arbitrarily along the circumference.

Furthermore, the form and/or position of the recess/es 40 can preferably be chosen arbitrarily.

Therefore, the present invention relates to a method for the production of layers of solid material, in particular for use as wafers, a separated wafer with almost no fluctuation in thickness being produced by means of a break initiation point generated in a defined manner.

LIST OF REFERENCE SIGNS 1. stabilisation layer
2. receiving layer
4. workpiece
5. layer of solid material
6. adhesive layer
8. connection layer
10. additional receiving layer
11. additional layer
12. peripheral region
13. centre
14. defined stress distribution
14a annular stress distribution
14b disc-shaped stress distribution
14c linear stress distribution
14d overlapping stress distribution
14e strip-shaped stress distribution
14f punctiform stress distribution
20. mounting
22. pulse emitting device
23. pulses
24. stress inducing means
25. additional stress inducing means
26. stresses induced by the pulse emitting device
27. recess
28. stresses induced by the stress inducing means
30. stresses induced by the additional stress inducing means
32. strengthened pulses
34. region with a large radius
38. projection
40. reduced thickness portion
42. stress inducing projection
44. break initiation point
46. pointed end
48. blast frosting device
L longitudinal axis of the stress inducing means
X width
Y length
Z thickness/depth

The invention claimed is:

1. A method for the production of layers of solid material for use as wafers, the method comprising:
    providing a workpiece for the separation of the layers of solid material, the workpiece having at least one exposed surface;
    producing and/or providing a carrier unit for receiving at least one layer of solid material, the carrier unit having a receiving layer for holding the layer of solid material, the receiving layer comprising a polymer;
    attaching the receiving layer to the exposed surface of the workpiece to facilitate forming a composite structure;
    exposing the composite structure including the receiving layer and the workpiece to an inner and/or outer stress field such that at least one part of the polymer undergoes at least one glass transition;
    producing a break initiation point with use of pre-defined local stress induction in a peripheral region at an edge of the workpiece; and
    separating the layer of solid material from the workpiece starting from the break initiation point.

2. The method according to claim 1 wherein the pre-defined local stress induction is brought about by exposing the composite structure to local cooling or heating, local exposure to sound waves or light waves, local exposure to electromagnetic fields, local exposure to the inverse piezo effect, and/or local exposure to radiation from a radiation source.

3. The method according to claim 2 wherein a stabilisation layer is disposed over the receiving layer to facilitate forming the composite structure and the pre-defined local stress induction is brought about by at least one stress inducing means formed in the composite structure that generates a stress peak in the layer of solid material to be separated such that the break initiation point is formed.

4. The method according to claim 3 wherein the stress inducing means is a projection formed on the stabilisation layer, in particular with a pointed end, or a recess formed in the latter.

5. The method according to claim 3 wherein the stress inducing means extends with its longitudinal axis in the longitudinal direction and/or in the depth direction of the stabilisation layer.

6. The method according to claim 3 wherein a plurality of the stress inducing means are formed on the stabilisation layer in the circumferential direction of the stabilisation layer.

7. The method according to any of claim 3 wherein the stress inducing means is a projection formed on the receiving layer with a pointed end or a recess formed in the receiving layer.

8. The method according to claim 2 wherein the pre-defined local stress induction is brought about with a pulse emitting device, the pulse emitting device emitting sound waves or light waves.

9. The method according to claim 8 wherein a number of pulse emitting devices are arranged in the circumferential direction of the workpiece and stresses are induced with the pulse emitting devices at a number of points provided in the circumferential direction of the workpiece.

10. The method according to claim 2 wherein the pre-defined local stress induction is brought about with a stress inducing means and a pulse emitting device, the stress inducing means being formed by a geometric configuration of the composite structure, and the pulse emitting device emitting light waves or sound waves.

11. The method according to claim 10 wherein the pre-defined local stress induction by means of the stress inducing means and the pulse emitting device is brought about at the same time.

12. The method according to claim 11 wherein the pre-defined local stress induction is brought about by the stress inducing means over a longer time than by the pulse emitting device, the pulse emitting device being controlled in particular dependently upon the stress inducing means.

13. The method according to claim 1 wherein:

pre-defined stress distribution within the workpiece is induced in order to specify, in a defined manner, a separation sequence when separating the layer of solid material from the workpiece, and the layer of solid material is separated from the workpiece along a plane extending within the workpiece according to the separating sequence influenced by the pre-defined stress distribution, the pre-defined stress distribution constituting stress distribution according to which the stress intensity within a plane of the workpiece passing from the centre of the workpiece towards the peripheral regions of the workpiece is at least partially different, the stress intensity in the centre of the workpiece being greater than close to the peripheral regions of the workpiece.

14. The method according to claim 1 wherein:

basic stresses in the workpiece are generated by tempering the receiving layer, the basic stresses being smaller than the stresses required for crack initiation; and the break initiation point is brought about by means of the pre-defined local stress induction in the peripheral region bringing about a local increase in stress, a period of time between generating the basic stresses and the local stress induction being specified in a defined manner.

* * * * *